(12) United States Patent
Chiang et al.

(10) Patent No.: US 11,744,009 B2
(45) Date of Patent: *Aug. 29, 2023

(54) ELECTRONIC MODULE

(71) Applicant: CYNTEC CO., LTD., Hsinchu (TW)

(72) Inventors: Kaipeng Chiang, Taoyuan (TW); Da-Jung Chen, Taoyuan (TW); Bau-Ru Lu, Changhua County (TW); Chun Hsien Lu, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/477,530

(22) Filed: Sep. 17, 2021

(65) Prior Publication Data

US 2022/0007502 A1  Jan. 6, 2022

Related U.S. Application Data

(63) Continuation-in-part of application No. 16/592,786, filed on Oct. 4, 2019, now Pat. No. 11,153,973.

(51) Int. Cl.
*H05K 1/02* (2006.01)
*H05K 1/14* (2006.01)

(52) U.S. Cl.
CPC ......... *H05K 1/0262* (2013.01); *H05K 1/0209* (2013.01); *H05K 1/141* (2013.01)

(58) Field of Classification Search
CPC ....... H05K 1/141; H05K 1/181; H01L 3/3128
See application file for complete search history.

(56) References Cited

U.S. PATENT DOCUMENTS

| | | | | |
|---|---|---|---|---|
| 5,270,492 A | * | 12/1993 | Fukui | H01L 23/49541 174/250 |
| 5,370,540 A | * | 12/1994 | Kobayashi | H01R 43/205 439/590 |
| 6,005,773 A | * | 12/1999 | Rozman | H02M 3/00 361/707 |
| 9,269,699 B2 | * | 2/2016 | Niu | H01L 21/76802 |

* cited by examiner

*Primary Examiner* — Mukundbhai G Patel
(74) *Attorney, Agent, or Firm* — Min-Lee Teng

(57) ABSTRACT

An electronic module, such as a VRM, has a power inductor and power wave pins disposed on a bottom surface of a circuit board so as to reduce the size and increase the heat dissipation capability of the VRM.

19 Claims, 8 Drawing Sheets

300A

ELECTRONIC MODULE

CROSS REFERENCE TO RELATED APPLICATIONS

This application is a continuation-in-part application of Ser. No. 16/592,786, filed Oct. 4, 2019, which is incorporated by reference.

BACKGROUND OF THE INVENTION

I. Field of the Invention

The present invention relates to an electronic module, and in particular, to a Voltage Regulator Module (VRM).

II. Description of Related Art

As applications of electronic circuits, such as a Voltage Regulator Module (VRM), move toward higher frequency and miniaturization, the distance between VRM and the processor in a server system becomes shorter and shorter so as to reduce the parasitic noise interference in the server system, as a result, the VRM becomes a heat source to the other components such as a processor, which might affect the operations of the processor.

Therefore, a better solution is needed to increase the heat dissipation capability of the VRM to minimize the impact to the other components such as a processor.

SUMMARY OF THE INVENTION

One objective of the present invention is to form an electronic module such as a VRM with a smaller size and larger heat dissipation capability.

In one embodiment of the present invention, an electronic module is disclosed, wherein the electronic module comprises: a circuit board, wherein a plurality of electronic devices are disposed on a top surface of the circuit board; an inductor, is disposed on a bottom surface of the circuit board; and a plurality of wave pins are disposed under the bottom surface of the circuit board, wherein each wave pin comprises a conductive body and at least one recess on a bottom surface of the conductive body, wherein the inductor is electrically connected to a wave pin of the plurality of wave pins.

In one embodiment, each wave pin comprises a conductive body and a plurality of recesses on a bottom surface of the conductive body.

In one embodiment, the conductive body comprises a conductive pillar.

In one embodiment, the conductive body comprises a copper pillar.

In one embodiment, the inductor is a power inductor for connecting to a power supply.

In one embodiment, the circuit board is a PCB.

In one embodiment, the recess has a circular shape.

In one embodiment, the plurality of electronic devices comprises a first MOSFET and a second MOSFET.

In one embodiment, the plurality of wave pins and a plurality of signal pins are disposed in a connecting board, wherein the connecting board is electrically connected to the circuit board via contact points on a top surface of the connecting board.

In one embodiment, the connecting board is a PCB.

In one embodiment, a heat sink is disposed over the plurality of electronic devices.

In one embodiment, a metal layer is electroplated on a top surface of the first MOSFET and a top surface of the second MOSFET, for dissipating heat generated by the first MOSFET and the second MOSFET.

In one embodiment, a first metal layer is electroplated on a top surface of the first MOSFET and a second metal layer is electroplated on a top surface of the second MOSFET, for dissipating heat generated by the first MOSFET and the second MOSFET, wherein the first metal layer and the second metal layer are separated by a gap.

In one embodiment, the plurality of wave pins and a plurality of signal pins are made through metal injection so as to form an insert-molded connecting board, wherein the plurality of wave pins and the plurality of signal pins are electrically connected to the circuit board.

In one embodiment, the plurality of wave pins and a plurality of signal pins are on a connector, wherein the connector is electrically connected to the circuit board.

In one embodiment, the plurality of wave pins and a plurality of signal pins are on a lead frame, wherein the lead frame is electrically connected to the circuit board.

In one embodiment, a molding body is disposed on a top surface of the circuit board to encapsulate the plurality of electronic devices and the heat sink, wherein a top surface of the heat sink is exposed from the molding body.

In one embodiment, the electronic module is a VRM.

In one embodiment of the present invention, an electronic module is disclosed, wherein the electronic module comprises: a circuit board, wherein a plurality of electronic devices are disposed on a top surface of the circuit board; a power inductor, is disposed on a bottom surface of the circuit board; and a plurality of pins, disposed on the bottom surface of the circuit board, wherein the power inductor is electrically connected to a pin of the plurality of pins.

In one embodiment, the circuit board is a PCB.

In one embodiment, the plurality of electronic devices comprises a first MOSFET and a second MOSFET.

In one embodiment, a heat sink is disposed over the plurality of electronic devices.

In one embodiment, a metal layer is electroplated on a top surface of the first MOSFET and a top surface of the second MOSFET, for dissipating heat generated by the first MOSFET and the second MOSFET.

In one embodiment, a first metal layer is electroplated on a top surface of the first MOSFET and a second metal layer is electroplated on a top surface of the second MOSFET, for dissipating heat generated by the first MOSFET and the second MOSFET, wherein the first metal layer and the second metal layer are separated by a gap.

In one embodiment, the plurality of pins are made through metal injection so as to form an insert molding, wherein the insert molding is electrically connected to the circuit board.

In one embodiment, the plurality of pins are on a connector, wherein the connector is electrically connected to the circuit board.

In one embodiment, the plurality of pins are on a lead frame, wherein the lead frame is electrically connected to the circuit board.

In one embodiment of the present invention, an electronic module is disclosed, wherein the electronic module comprises: a circuit board, wherein a plurality of electronic devices are disposed on a top surface of the circuit board; an inductor, is disposed on a bottom surface of the circuit board; and a plurality of wave pins, disposed under the bottom surface of the circuit board, wherein each wave pin comprises a conductive body and at least one first recess on a bottom surface of the conductive body, wherein the first wave pin and a second wave pin are located at two opposite sides of the inductor, and the inductor is electrically connected to at least one wave pin of the plurality of wave pins.

In one embodiment of the present invention, an electronic module is disclosed, wherein the electronic module comprises: a circuit board, wherein a plurality of electronic devices are disposed on a top surface of the circuit board; an inductor, disposed on a bottom surface of the circuit board; and a plurality of wave pins, disposed under the bottom surface of the circuit board, wherein each wave pin comprises a conductive body and at least one first recess on a bottom surface of the conductive body, wherein a first wave pin comprises a second recess on a top surface of the first wave pin, wherein a soldering material is disposed in the second recess.

In one embodiment of the present invention, an electronic module is disclosed, wherein the electronic module comprises: a circuit board, wherein a plurality of electronic devices are disposed on a top surface of the circuit board; an inductor, disposed on a bottom surface of the circuit board; and a plurality of wave pins, disposed under the bottom surface of the circuit board, wherein each wave pin comprises a conductive body and at least one first recess on a bottom surface of the conductive body, wherein a first wave pin comprises a second recess on a top surface of the first wave pin, wherein a soldering material is disposed in the second recess; and wherein the first wave pin comprises a third recess on a lateral surface of the first wave pin, wherein a molding body encapsulates the lateral surface of the first wave pin and extending into the third recess.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
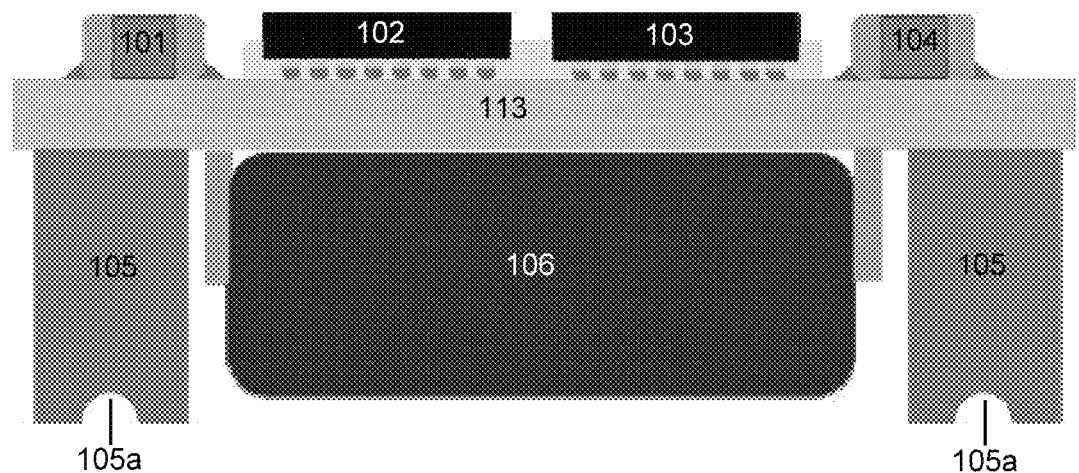
FIG. 1A depicts a side view of an electronic module according to one embodiment of the present invention.

FIG. 1A depicts a side view of an electronic module 100 according to one embodiment of the present invention, wherein the electronic module 100 comprising: a circuit board 113, wherein a plurality of electronic devices 101, 102, 103, 104 are disposed on a top surface of the circuit board 113 comprises a plurality of conductive patterns; an inductor 106, disposed on a bottom surface of the circuit board 113 and electrically connected to a conductive pattern of the circuit board 113; and a plurality of wave pins 105 are disposed under the bottom surface of the circuit board 113 and each of plurality of wave pins 105 is electrically connected to a conductive pattern of the circuit board 113, wherein each of the wave pins 105 comprises at least one recess 105a on a bottom surface of the wave pin 105, wherein the inductor 106 is electrically connected to a wave pin 105 for connecting to an external circuit, such as a motherboard. In one embodiment, the plurality of electronic devices comprises active devices. In one embodiment, the plurality of electronic devices comprises active devices and passive devices.

In one embodiment, each wave pin comprises a conductive body and a plurality of recesses on a bottom surface of the conductive body.

In one embodiment, each conductive body comprises a conductive pillar.

In one embodiment, each conductive body comprises a conductive pillar made of metal.

In one embodiment, each conductive body comprises a copper pillar.

In one embodiment, the electronic module comprises a VRM, and the inductor 106 is a power inductor for connecting to a power supply, wherein the power inductor can sustain a larger current flowing from the power supply.

In one embodiment, the electronic module 100 is a VRM, and the inductor 106 is a power inductor for connecting to a power supply, wherein the power inductor can sustain a larger current flowing from the power supply.

In one embodiment, the circuit board 113 is a PCB.

In one embodiment, the circuit board 113 comprises a metallic substrate.

In one embodiment, the circuit board 113 comprises a ceramic substrate.

In one embodiment, the circuit board 113 comprises a lead frame.

In one embodiment, the recess 105a has a semi-circular shape.

In one embodiment, the recess 105a has a semi-square shape.

In one embodiment, the plurality of electronic devices comprises a first MOSFET 102 and a second MOSFET 103.

Figure 1B:
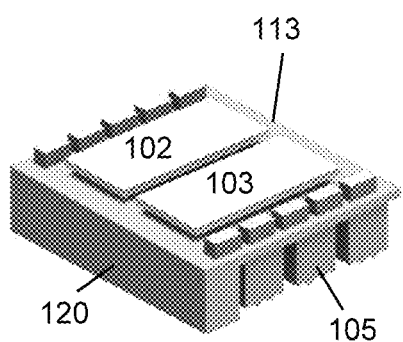
FIG. 1B depicts a top view of an electronic module according to one embodiment of the present invention.
Figure 1C:
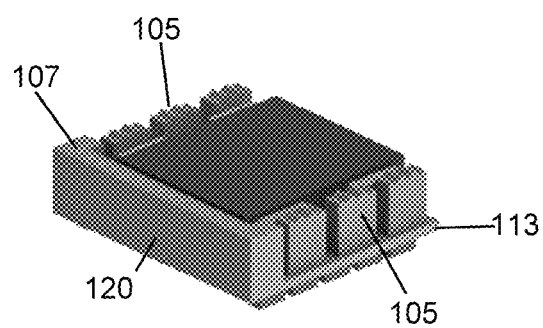
FIG. 1C depicts a bottom view of an electronic module according to one embodiment of the present invention.

FIG. 1B shows the top view of the electronic module 100 and FIG. 1C shows the bottom view of the electronic module 100. In one embodiment, as shown in FIG. 1B and FIG. 1C, a plurality of signal pins 107 are disposed in a connecting board 120, wherein the plurality of signal pins 107 are electrically connected to the circuit board 113.

In one embodiment, the connecting board 120 is a PCB.

In one embodiment, the connecting board 120 comprises a metallic substrate.

In one embodiment, the connecting board 120 comprises a ceramic substrate.

In one embodiment, the connecting board 120 comprises a lead frame.

In one embodiment, the circuit board 113 and the connecting board 120 are made of the same unitary insulating substrate, so that there is no need to have two separate boards 113, 120.

In one embodiment, the circuit board 113 and the connecting board 120 are made of the same unitary metallic substrate, so that there is no need to have two separate boards 113, 120.

Figure 2:
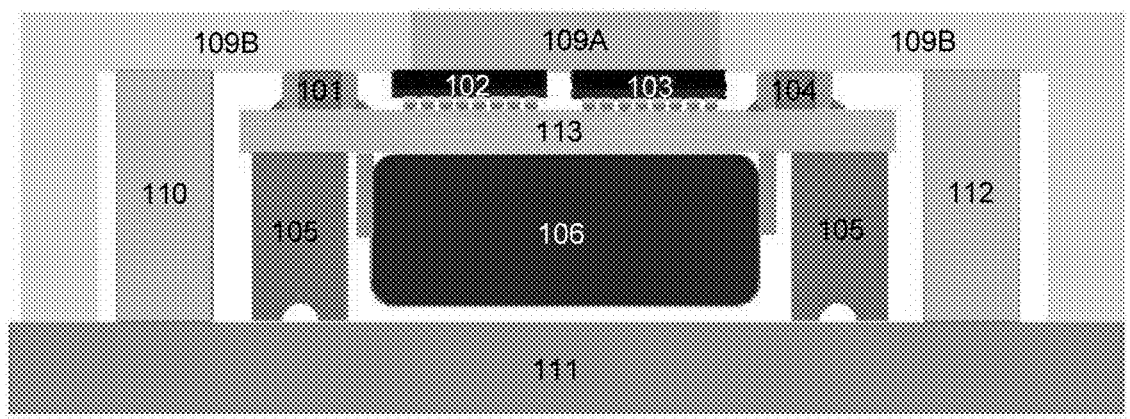
FIG. 2 depicts a side view of an electronic module according to one embodiment of the present invention.

FIG. 2 depicts a side view of an electronic module 200 according to one embodiment of the present invention, wherein a heat sink having portions 109A, 109B is disposed over the plurality of electronic devices 101, 102, 103, 104. In one embodiment, the portions 109A, 109B are made of the same material and portions 109A, 109B are integrated formed. In one embodiment, the portions 109A, 109B are made of different materials, wherein the portion 109A can be integrated with the active devices 102, 103 or can be made of a material that has a larger heat dissipation capability than the portion 109B. In one embodiment, spacers 110 can be disposed between the heat sink 109B and a motherboard 111.

Figure 3A:
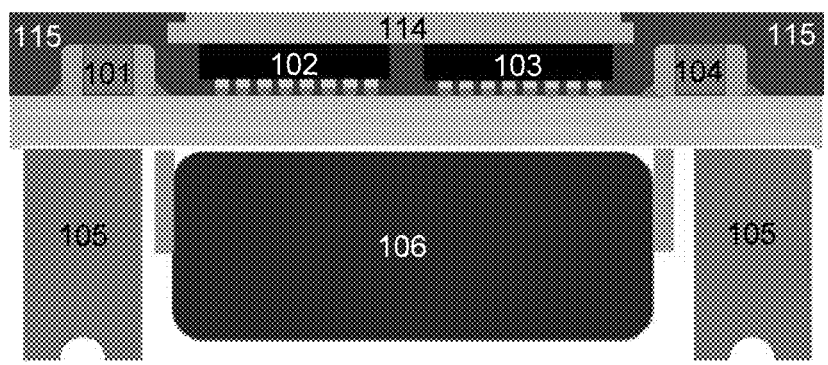
FIG. 3A depicts a side view of an electronic module according to one embodiment of the present invention.

FIG. 3A depicts a side view of an electronic module 300A according to one embodiment of the present invention, wherein a heat sink 114 made of metal that is electroplated on a top surface of the first MOSFET 102 and a top surface of the second MOSFET 103, for dissipating heat generated by the first MOSFET 102 and the second MOSFET 103.

Figure 3B:
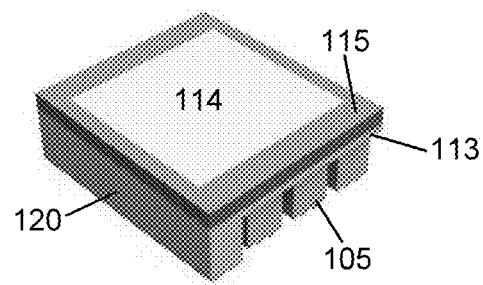
FIG. 3B depicts a top view of an electronic module according to one embodiment of the present invention.

In one embodiment, as shown in FIG. 3A, a molding material is disposed on a top surface of the circuit board 113 to encapsulate the plurality of electronic devices 101, 102, 103, 104 and the heat sink 114 to form a molding body 115, wherein a top surface of the heat sink 114 is exposed from the molding body 115 for dissipating heat, as shown in FIG. 3B which shows a bottom view of the electronic module 300A.

In one embodiment the molding body 115 is made of EMC (Epoxy molding compound).

Figure 3C:
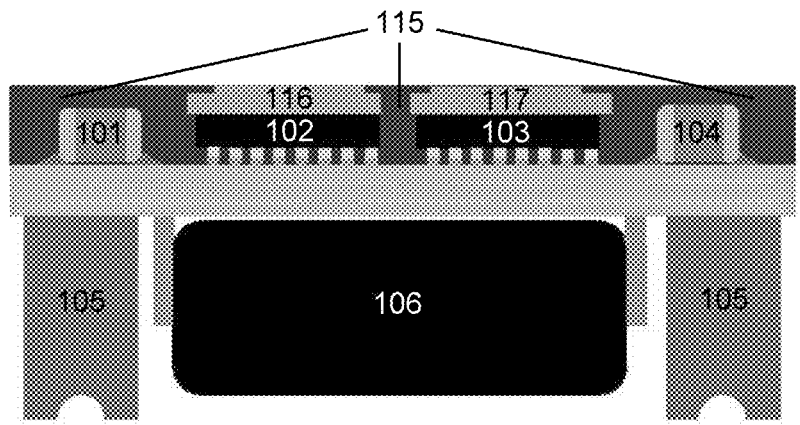
FIG. 3C depicts a side view of an electronic module according to one embodiment of the present invention.

FIG. 3C depicts a side view of an electronic module 300B according to one embodiment of the present invention, wherein a first metal layer 116 is electroplated on a top surface of the first MOSFET 102 and a second metal layer 117 is electroplated on a top surface of the second MOSFET 103, for dissipating heat generated by the first MOSFET 102 and the second MOSFET 103, wherein the first metal layer 116 and the second metal layer 117 are separated by a gap. In one embodiment, a molding material encapsulates the plurality of electronic devices 101, 102, 103, 104 to form a molding body 115. In one embodiment, a molding material encapsulates the plurality of electronic devices 101, 102, 103, 104 and extends into said gap between the first metal layer 116 and the second metal layer 117, so as to form a molding body 115.

In one embodiment, the top surface of the heat sink 116, 117 are exposed from the molding body 115.

Figure 4A:
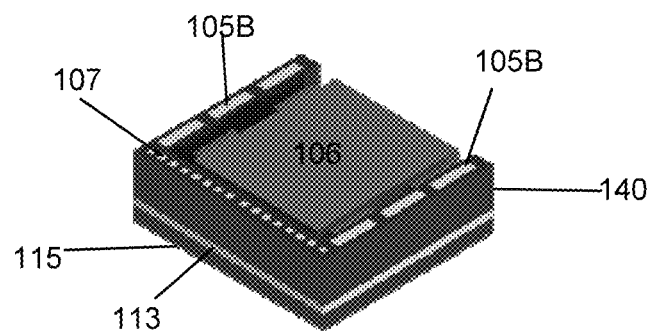
FIG. 4A depicts a bottom view of an electronic module according to one embodiment of the present invention.

In one embodiment, instead of using the power wave pins 105 in each of the electronic module 100, 200, 300A, 300B, a plurality of power pins 105B and a plurality of signal pins 107 can be disposed on the bottom surface of the circuit board 113, as shown in FIG. 4A which depicts a bottom view of the electronic module 100, 200, 300A, 300B when power wave pins 105 are not used, wherein each pin is electrically connected to the bottom surface of the circuit board 113, wherein the power pin 105B has a larger size than the signal pin 107 and the bottom surface of each power pin 105B can have a flat surface.

Figure 3D:
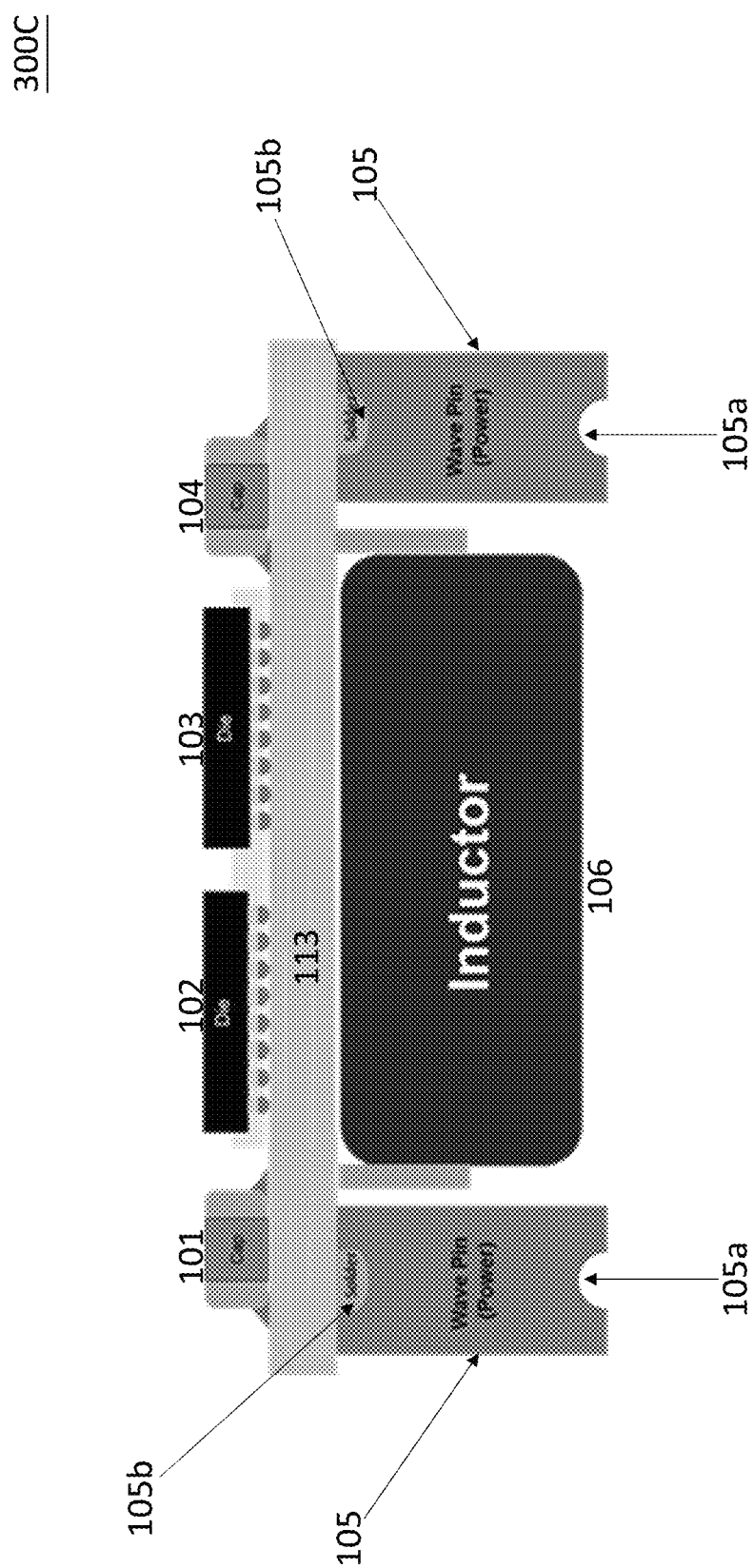
FIG. 3D depicts a side view of an electronic module according to one embodiment of the present invention.

FIG. 3D depicts a top view of the electronic module 300C according to one embodiment of the present invention, wherein the electronic module 300C comprises: a circuit board 113, wherein a plurality of electronic devices 102, 103 are disposed on a top surface of the circuit board 113; an inductor 106, is disposed on a bottom surface of the circuit board 113; and a plurality of wave pins 105, disposed under the bottom surface of the circuit board 113, wherein each wave pin comprises a conductive body and at least one first recess 105a on a bottom surface of the conductive body, wherein the first wave pin 105 and a second wave pin 105 are located at two opposite sides of the inductor 106, and the inductor 106 is electrically connected to at least one wave pin of the plurality of wave pins 105.

In one embodiment, a top surface of the second wave pin 105 is in contact with the bottom surface of the circuit board 113, and a top surface of the first wave pin 105 is in contact with the bottom surface of the circuit board 113.

In one embodiment, the first wave pin 105 comprises a second recess 105b on a top surface of the first wave pin 105, wherein a conductive material is disposed in the second recess 105b. In one embodiment, a soldering material is disposed in the second recess 105b; in one embodiment, a conductive and adhesive material is disposed in the second recess 105b, for strengthen the mechanical strength between the circuit board 113 and the first wave pin 105.

Figure 3E:
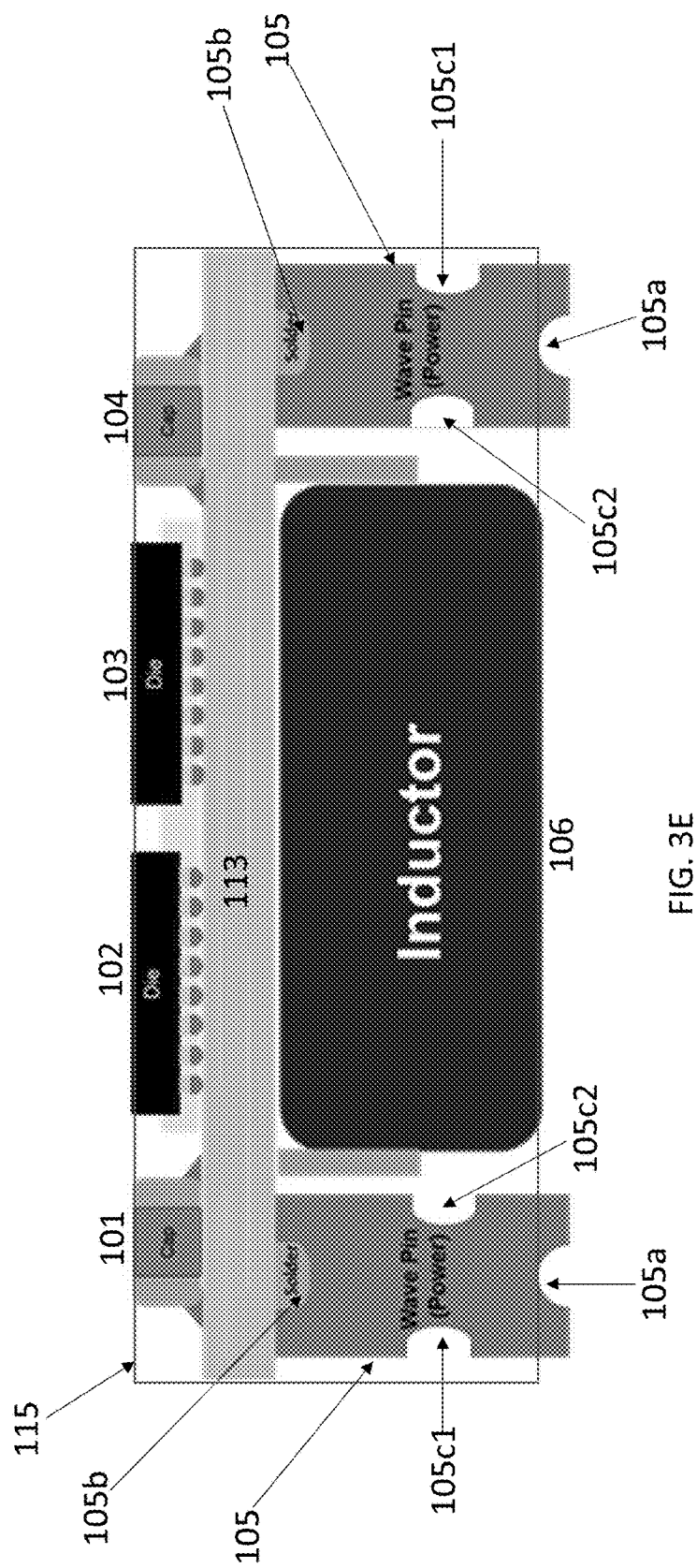
FIG. 3E depicts a side view of an electronic module according to one embodiment of the present invention.

In one embodiment, the first wave pin comprises a third recess 105c1 on a first lateral surface of the first wave pin 105, In one embodiment, a molding body encapsulates the plurality of electronic devices 102, 103, the circuit board 113 and the plurality of wave pins 105, wherein the molding body 115 encapsulates the first lateral surface of the first wave pin 105 and extending into the third recess 105c1, as shown in FIG. 3E.

In one embodiment, the first wave pin comprises a fourth recess 105c2 on a second lateral surface of the first wave pin 105, wherein the molding body 115 encapsulates the first lateral surface and the second lateral surface of the first wave pin 105 and extending into the third recess 105c1 and the fourth recess 105c2, as shown in FIG. 3E.

In one embodiment, as shown in FIG. 4A, the plurality of power pins 105B and the plurality of signal pins 107 are made through a process of insert molding, so as to form an insert-molded connecting board 140, wherein the plurality of power pins 105B and the plurality of signal pins 107, in the insert-molded connecting board 140, are electrically connected to the circuit board 113.

Figure 4B:
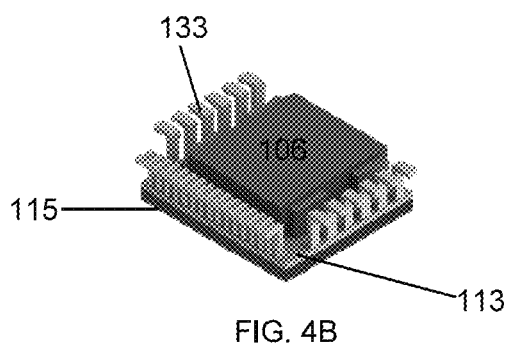
FIG. 4B depicts a bottom view of an electronic module according to one embodiment of the present invention.

In one embodiment, the plurality of pins 133 are made by a lead frame, wherein the plurality of pins 133 are electrically connected to the circuit board 113, as shown in FIG. 4B.

Figure 4C:
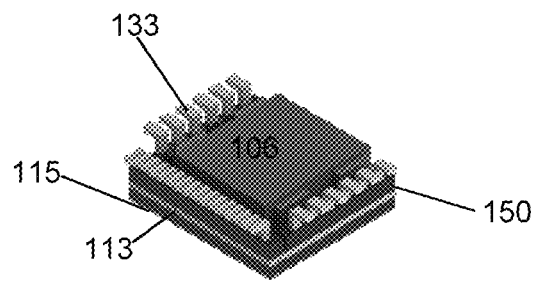
FIG. 4C depicts a bottom view of an electronic module according to one embodiment of the present invention.

In one embodiment, the plurality of pins 133 are on a connector 150, wherein the plurality of pins 133 are electrically connected to the circuit board 113, as shown in FIG. 4C.

Figure 5:
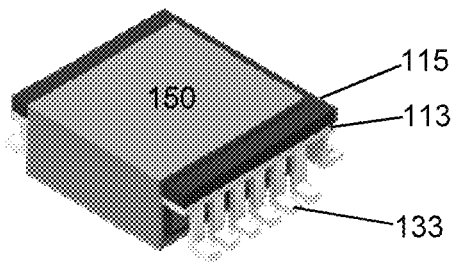
FIG. 5 depicts a top view of an electronic module according to one embodiment of the present invention.

FIG. 5 depicts a top view of the electronic module according to one embodiment of the present invention, wherein a heat sink 150 can be disposed on the molding body 115 to dissipate the heat generated by the electronic module.

What is claimed is:
1. An electronic module, comprising:
   a circuit board, wherein a plurality of electronic devices are disposed on a top surface of the circuit board;
   an inductor, disposed on a bottom surface of the circuit board; and a plurality of wave pins, disposed under the bottom surface of the circuit board, wherein each wave pin comprises a conductive body and at least one first recess on a bottom surface of the conductive body, wherein a first wave pin and a second wave pin are located at two opposite sides of the inductor, and the inductor is electrically connected to at least one wave pin of the plurality of wave pins, wherein the first wave pin comprises a second recess on a top surface of the first wave pin, wherein a soldering material is disposed in the second recess.

2. The electronic module according to claim 1, wherein the inductor is a power inductor for connecting to a power supply.

3. The electronic module according to claim 2, wherein the first wave pin comprises a third recess on a lateral surface of the first wave pin, wherein a molding material encapsulates the lateral surface of the first wave pin and extending into the third recess.

4. The electronic module according to claim 1, wherein a top surface of the second wave pin is in contact with the bottom surface of the circuit board, and a top surface of the first wave pin is in contact with the bottom surface of the circuit board.

5. The electronic module according to claim 1, wherein the plurality of wave pins and a plurality of signal pins are disposed in a connecting board, wherein the plurality of wave pins and the plurality of signal pins are electrically connected to the circuit board.

6. The electronic module according to claim 1, wherein a contiguous metal layer is electroplated on a top surface of a first MOSFET and a top surface of the second MOSFET, for dissipating heat generated by the first MOSFET and the second MOSFET.

7. The electronic module according to claim 1, wherein a first metal layer is electroplated on a top surface of a first MOSFET and a second metal layer is electroplated on a top surface of a second MOSFET, for dissipating heat generated by the first MOSFET and the second MOSFET, wherein the first metal layer and the second metal layer are separated by a horizontal gap.

8. The electronic module according to claim 1, wherein the plurality of wave pins and a plurality of signal pins are on a connector, wherein the plurality of wave pins and the plurality of signal pins are electrically connected to the circuit board.

9. The electronic module according to claim 1, wherein the plurality of wave pins and a plurality of signal pins are made by a lead frame, wherein the plurality of wave pins and the plurality of signal pins are electrically connected to the circuit board.

10. The electronic module according to claim 9, wherein a molding body encapsulates the plurality of electronic devices and the plurality of wave pins.

11. The electronic module according to claim 1, wherein each wave pin comprises a conductive body and a plurality of recesses on a bottom surface of the conductive body.

12. The electronic module according to claim 1, wherein the conductive body comprises a conductive pillar.

13. An electronic module, comprising:
a circuit board, wherein a plurality of electronic devices are disposed on a top surface of the circuit board;
an inductor, disposed on a bottom surface of the circuit board; and
a plurality of wave pins, disposed under the bottom surface of the circuit board, wherein each wave pin comprises a conductive body and at least one first recess on a bottom surface of the conductive body, wherein a first wave pin comprises a second recess on a top surface of the first wave pin, wherein a conductive material is disposed in the second recess.

14. An electronic module, comprising:
a circuit board, wherein a plurality of electronic devices are disposed on a top surface of the circuit board;
an inductor, disposed on a bottom surface of the circuit board; and
a plurality of wave pins, disposed under the bottom surface of the circuit board, wherein each wave pin comprises a conductive body and at least one first recess on a bottom surface of the conductive body, wherein a first wave pin comprises a second recess on a top surface of the first wave pin, wherein a soldering material is disposed in the second recess.

15. An electronic module, comprising:
a circuit board, wherein a plurality of electronic devices are disposed on a top surface of the circuit board;
an inductor, disposed on a bottom surface of the circuit board; and
a plurality of wave pins, disposed under the bottom surface of the circuit board, wherein each wave pin comprises a conductive body and at least one first recess on a bottom surface of the conductive body, wherein a first wave pin comprises a second recess on a top surface of the first wave pin, wherein a conductive material is disposed in the second recess; and
wherein the first wave pin comprises a third recess on a lateral surface of the first wave pin, wherein a molding body encapsulates the lateral surface of the first wave pin and extending into the third recess.

16. The electronic module according to claim 15, wherein a second wave pin comprises a fourth recess on a top surface of the second wave pin, and the second wave pin comprises a fifth recess on a lateral surface of the second wave pin, wherein the conductive material is disposed in the fourth recess, and the molding body encapsulates the lateral surface of the second wave pin and extending into the fifth recess.

17. The electronic module according to claim 15, wherein the inductor is a power inductor for connecting to a power supply.

18. The electronic module according to claim 15, wherein a top surface of the second wave pin is in contact with the bottom surface of the circuit board, and a top surface of the first wave pin is in contact with the bottom surface of the circuit board.

19. The electronic module according to claim 15, wherein the molding body encapsulates the plurality of electronic devices, the circuit board, and the plurality of wave pins.

* * * * *